US006765381B2

(12) United States Patent
Barbara

(10) Patent No.: US 6,765,381 B2
(45) Date of Patent: Jul. 20, 2004

(54) EXTENDED MAXWELL PAIR GRADIENT COILS

(75) Inventor: Thomas M. Barbara, Mountain View, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/927,265

(22) Filed: Aug. 10, 2001

(65) Prior Publication Data

US 2003/0030438 A1 Feb. 13, 2003

(51) Int. Cl.[7] .................................................. G01V 3/00
(52) U.S. Cl. ...................................................... 324/318
(58) Field of Search ................................. 324/300, 307, 324/309, 318, 320, 322; 600/427, 410, 422

(56) References Cited

U.S. PATENT DOCUMENTS

| | | | | |
|---|---|---|---|---|
| 4,633,179 A | * | 12/1986 | Sugimoto .................... 324/307 |
| 4,733,189 A | * | 3/1988 | Punchard et al. ............ 324/318 |
| 4,978,920 A | * | 12/1990 | Mansfield et al. ........... 324/318 |
| 5,185,576 A | * | 2/1993 | Vavrek et al. ............... 324/318 |
| 5,208,536 A | * | 5/1993 | Cory ........................... 324/307 |
| 5,278,504 A | * | 1/1994 | Patrick et al. ............... 324/318 |
| 5,289,128 A | * | 2/1994 | DeMeester et al. .......... 324/318 |
| 5,343,148 A | * | 8/1994 | Westphal et al. ............ 324/309 |
| 5,378,989 A | * | 1/1995 | Barber et al. ................ 324/318 |
| 5,431,164 A | * | 7/1995 | Westphal et al. ............ 600/427 |
| 5,512,828 A | * | 4/1996 | Pausch et al. ............... 324/309 |
| 5,530,355 A | * | 6/1996 | Doty ........................... 324/318 |
| 5,568,051 A | * | 10/1996 | Yamagata .................... 324/318 |
| 5,663,648 A | * | 9/1997 | Chapman et al. ............ 324/318 |
| 5,729,141 A | * | 3/1998 | Hass et al. ................... 324/318 |
| 5,764,059 A | * | 6/1998 | Mansfield et al. ........... 324/318 |
| 6,448,774 B1 | * | 9/2002 | Heid ............................ 324/318 |
| 6,556,012 B2 | * | 4/2003 | Yamashita ................... 324/318 |

OTHER PUBLICATIONS

Article by Turner, R., entitled "A Target Field Approach to Optimal Coil Design", published in J. Phys. D: Appl.Phys. 19 (1986), pp. L147–L151.

Article by Turner, et al., entitled "Passive Screening of Switched Magnetic Field Gradients", published in J. Phys. E: Sci. Instrum. 19, (1986, pp. 876–879.

* cited by examiner

Primary Examiner—Diego Gutierrez
Assistant Examiner—Dixomara Vargas
(74) Attorney, Agent, or Firm—Edward H. Berkowitz; Bella Fishman

(57) ABSTRACT

An extended Maxwell pair has a pair of cylindrical gradient coils disposed coaxially, carrying equal currents in mutually opposite directions. Each of these gradient coils may be surrounded by a coaxially disposed cylindrically extended shield coil so as to cancel the magnetic field outside. For given values of radii of the gradient and shield coils, the length and the center-to-center separation of the pair of gradient coils are determined by numerically solving an equation which is derived from the condition that the currents through the gradient and shield coils should together generate a magnetic field inside with a linear gradient. The equation to be solved is derived by calculating the magnetic field by a Fourier-Bessel expansion method incorporating the condition that the shield coils do shield the magnetic field inside and cancel the field outside the system.

14 Claims, 3 Drawing Sheets

EXTENDED MAXWELL PAIR GRADIENT COILS

FIELD OF THE INVENTION

This invention is in the technical field of coil design, for example, for use in nuclear magnetic resonance (NMR) applications.

BACKGROUND OF THE INVENTION

This invention relates to means for providing a magnetic field with a uniform gradient suitable for use in NMR applications. A classic approach to this purpose has been to use a pair of loop coils known as the Maxwell pair, characterized as being placed symmetrically about the sample, carrying equal but opposite currents and being separated by a distance √3 times the loop radius.

There have been at least the following two problems with a Maxwell pair. One of them is that the gradient coils of a Maxwell pair is usually constructed with an additional coil wound at a larger radius and carrying a current so as to cancel the magnetic field exterior to the coil structure and the presence of such shield windings affects the condition for linearity of the gradient of the magnetic field being generated. The other of the problems is that a Maxwell pair thus shielded can be constructed as long as the diameter of the wire used for the pair is small enough compared to the radius of the coil, but this makes the gradient strength per ampere of current too small for NMR applications. If additional windings are to be added in order to enhance the field gradient, however, the spatial extent of these windings must also be small compared to the loop diameter of the pair.

SUMMARY OF THE INVENTION

It is therefore an object of this invention to provide a pair of extended coils, such that currents may reside along a length comparable to the loop diameter, capable of providing a magnetic field with a stronger uniform field gradient.

An extended Maxwell pair embodying this invention, with which the above and other objects can be accomplished, may be characterized as comprising a pair of cylindrical gradient coils disposed coaxially and adapted to carry equal currents in mutually opposite directions. Each of these gradient coils may be surrounded by a coaxially disposed cylindrically extended shield coil for canceling magnetic fields outside. For given values of radii of the gradient and shield coils, the length and the center-to-center separation of the pair of gradient coils are determined by numerically solving an equation which is derived from the condition that the currents through the gradient and shield coils should together generate a magnetic field inside with a linear gradient. The equation to be solved is derived by calculating the magnetic field by a Fourier-Bessel expansion method incorporating the condition that the shield coils do shield the magnetic field inside. The manner in which a wire should be wound to form the shield coils is determined from the numerical solution of the equation.

BRIEF DESCRIPTION OF THE DRAWINGS

The accompanying drawings, which are incorporated in and form a part of this specification, illustrate embodiments of the invention and, together with the description, serve to explain the principles of the invention. In the drawings.

DETAILED DESCRIPTION OF THE INVENTION

Figure 1:
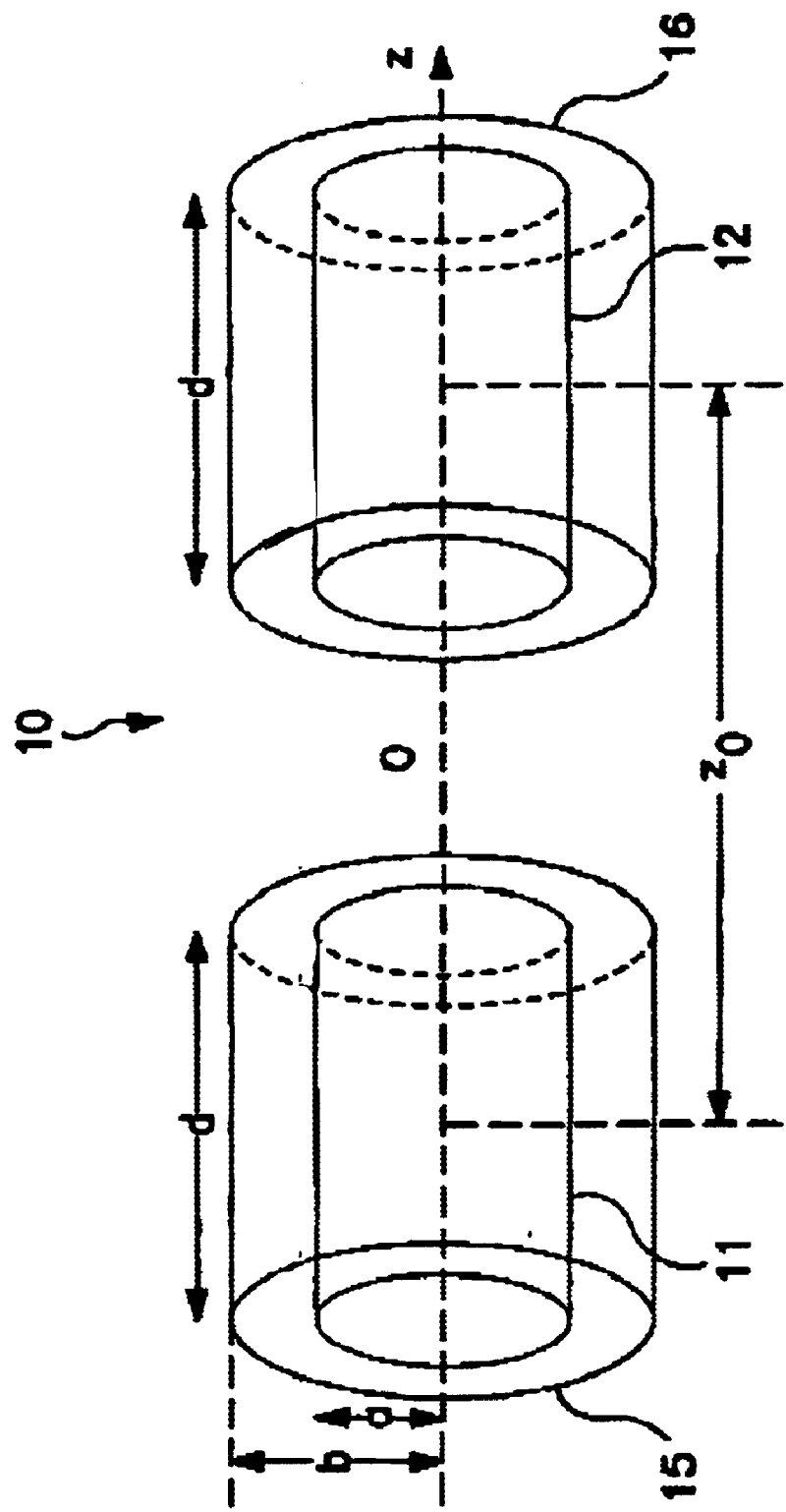
FIG. 1 is a sketch of an extended Maxwell pair of gradient coils embodying this invention for showing their dimensional relationships.

This invention relates to a so-called extended Maxwell pair 10 comprising, as schematically shown in FIG. 1, a coaxially disposed pair of cylindrical primary (gradient) coils 11 and 12 and another coaxially disposed pair of cylindrical secondary (shield) coils 15 and 16. The radius and the length of each of the primary coils 11 and 12 are denoted by letters a and d, respectively, and their common central axis will be defined as the z-axis, for the convenience of description. The center-to-center separation between the two primary coils 11 and 12 is denoted by symbol $z_0$ (>d), and the point of symmetry on the z-axis is defined as the origin O of the coordinate system to be used for the description. The radius of the secondary coils 15 and 16 is denoted by letter b (>a). The shield coils 15 and 16 are disposed not only coaxially with respect to each other but also with the primary coils 11 and 12, each enclosing a corresponding one of the primary coils 11 and 12 inside. Each of the shield coils 15 and 16 is at least of the length of the primary coils 11 and 12.

Although not shown in FIG. 1 for the convenience of disclosure, the two pairs of these coils 11, 12, 15 and 16 are adapted to be fed equal currents, the currents through each pair being in mutually opposite directions and the currents through each of the primary coils 11 and 12 and the corresponding one of the secondary coils being also in opposite directions.

A method of using a Fourier-Bessel expansion of the magnetic field generated by currents flowing on a cylinder has been discussed by R. Turner (in an article entitled "A target field approach to optimal coil design" which appeared in J. Phys. D: Appl. Phys. 19 (1986) L147–L151) and the problem of shielding a gradient magnetic field has been discussed by R. Turner and R. M. Bowley (in an article entitled "Passive screening of switched magnetic field gradients" which appeared in J. Phys. E: Sci. Instrum. 19, 876 (1986)). Both of these articles will be herein incorporated by reference.

Because the coils 11, 12, 15 and 16 are arranged in a cylindrically symmetric manner, cylindrical coordinates will be used, as done in the incorporated references which showed, given a surface current distribution $j(\phi, z)$ flowing on the surface of a cylinder of radius a, how to write the axial component (z-component) of the magnetic field $B_z$ in the form of Fourier-Bessel series. Where, as here, the configuration is symmetric, however, this series expression becomes much simplified.

For the convenience of discussion, let $j^P(\phi, z)$ indicate the surface current distribution (or current density in units of ampere/cm) of the primary coils 11 and 12 and the current function $I^P(z)$ (in units of amperes) related to the primary coils 11 and 12 be defines as follows:

$$I^p(z) = \int_{-\infty}^{z} dz' \, j^p(\varphi, z').$$

Figure 2:
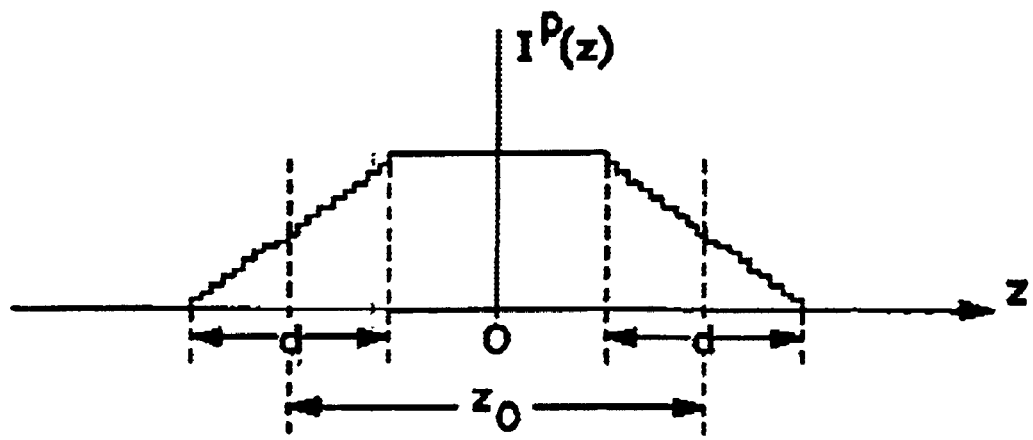
FIG. 2 is a graph showing an example of current function related to the primary coils of FIG. 1 when they are formed by a uniformly and tightly wound wire.
Figure 3:
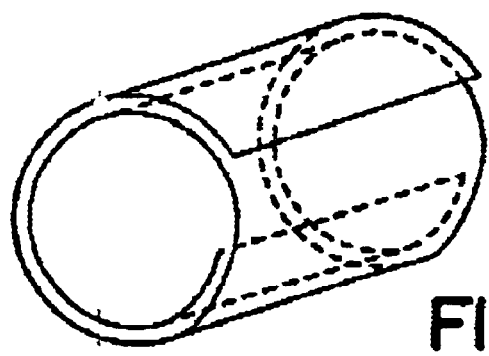
FIG. 3 is a sketch of an example of primary coil.
Figure 4:
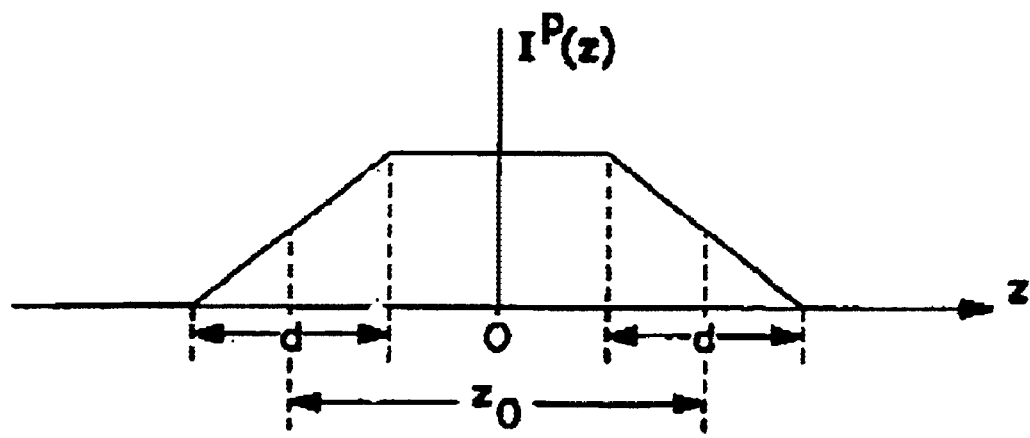
FIG. 4 is a graph showing the current function related to primary coils structured as shown in FIG. 3.

If the primary coils 11 and 12 are each formed by tightly winding a thin wire uniformly a same number of times, for example, such that the azimuthal current density is nearly constant (a positive number for one of the coils and the same negative number for the other) over a distance d along the z-axis for each coil and zero elsewhere, the corresponding current function $I^p(z)$ will looked as shown in FIG. 2, the small steps in the sloped regions corresponding to the individual loops of the wound wire. If the primary coils 11 and 12 are each formed by helically rolling a rectangular conductor sheet, as shown in FIG. 3, the current therethrough will be uniform along the z-axis and the corresponding current function $I^p(z)$ will look as shown in FIG. 4, the small steps in FIG. 2 disappearing. If the surface current distribution of the primary coils 11 and 12 is such that their current function is given as shown in FIG. 2, or approximately as shown in FIG. 4, the azimuthal component of their current distribution, Fourier-transformed into k-space, is given by:

$$J_\phi^p(k) = 2i(I/d) \sin(kd/2) \sin(kz_0/2)/(kd/2) \quad (1)$$

where $i=\sqrt{-1}$. The corresponding current function $I^p(k)$ in k-space is related to this as follows:

$$J_\phi^p(k) = k I^p(k).$$

The axial component of this distribution can be obtained therefrom by conservation of current. If the azimuthal component of the current distribution of the secondary coils 15 and 16 (each with radius b) is similarly Fourier-transformed into k-space, the condition that the secondary coils 15 and 16 serve to cancel the exterior field (hereinafter referred to as "the shielding condition") is translated into the following relationship:

$$J_\phi^s(k) = -(a/b)(I_1(ka)/I_1(kb))J_\phi^p(k) \quad (2)$$

where $I_1$ is the first order modified Bessel function of the first kind. In terms of the current functions for the primary and secondary coils, the aforementioned shielding condition is written as follows:

$$I^s(k) = -(a/b)(I_1(ka)/I_1(kb))I^p(k) \quad (2')$$

where $I^s(k)$ is defined in terms of the surface current density $j^s(\phi, z)$ of the secondary coils as $I^p(k)$ was defined above in terms of $j^p(\phi, z)$.

The z-component of the magnetic field $B_z$ near the origin O can be calculated by a method described in the cited references and will take the following form, if Taylor-expanded into a polynomial form:

$$B_z(z) = B_z(0) + c_1 z + c_3 z^3 + c_5 z^5 + \ldots$$

where $B_z(0) = 0$ and $c_1, c_3, c_5$, etc. are constants not including z, the terms with even powers of z being excluded because of the symmetry property of the system.

To improve the linearity of the gradient near the origin O, the first non-linear term is set equal to zero, or $c_3 = 0$. This leads to the following linearity-establishing condition:

$$\int_0^{k_{max}} dk \, k^5 I_\varphi^p(k) S_0(k) K_0'(ka) I_0(k\rho) = 0 \quad (3)$$

where $\rho$ is the radial distance from the z-axis, K is the Bessel function of the second kind, $k_{max}$ is a suitable upper limit of the integration, and $S_0(k)$ may be referred to as the shielding factor, given by $$S_0(k) = 1 - K_1(kb)I_1(ka)/K_1(ka)I_1(kb). \quad (4)$$

The linearity-establishing condition (3) given above should ideally hold for all values of $\pi$. For practical applications in NMR, however, $\pi$ may be set equal to the maximum value of a region occupied by the sample. For an NMR tube of radius 5 mm, for example, $\pi$ may be set equal to 2.5 mm.

If the primary coils 11 and 12 are structured such that their current distribution is given by (1), in particular, the linearity-establishing equation takes the following form:

$$\int_0^{k_{max}} dk \, k^4 \{\sin(kd/2)\sin(kz_0/2)/(kd/2)\} S_0(k) K_0'(ka) I_0(k_\rho) = 0.$$

For designing an extended Maxwell pair embodying this invention, the equation given above for the linearity-establishing condition is numerically solved to obtain $z_0$, once values for a, b and d are selected. It may alternatively be solved for d by selecting values of a, b and $z_0$.

After both the length d and the separation $z_0$ of the primary coils 11 and 12 have been thus determined, $I^s(k)$ becomes a function of a known form from the relationship (2) given above representing the shielding condition. The manner in which the secondary coils 15 and 16 should be wound may be determined as follows from $I^s(z)$ which is obtained by inverse Fourier transformation of $I^s(k)$ back into z-space.

Figure 5:
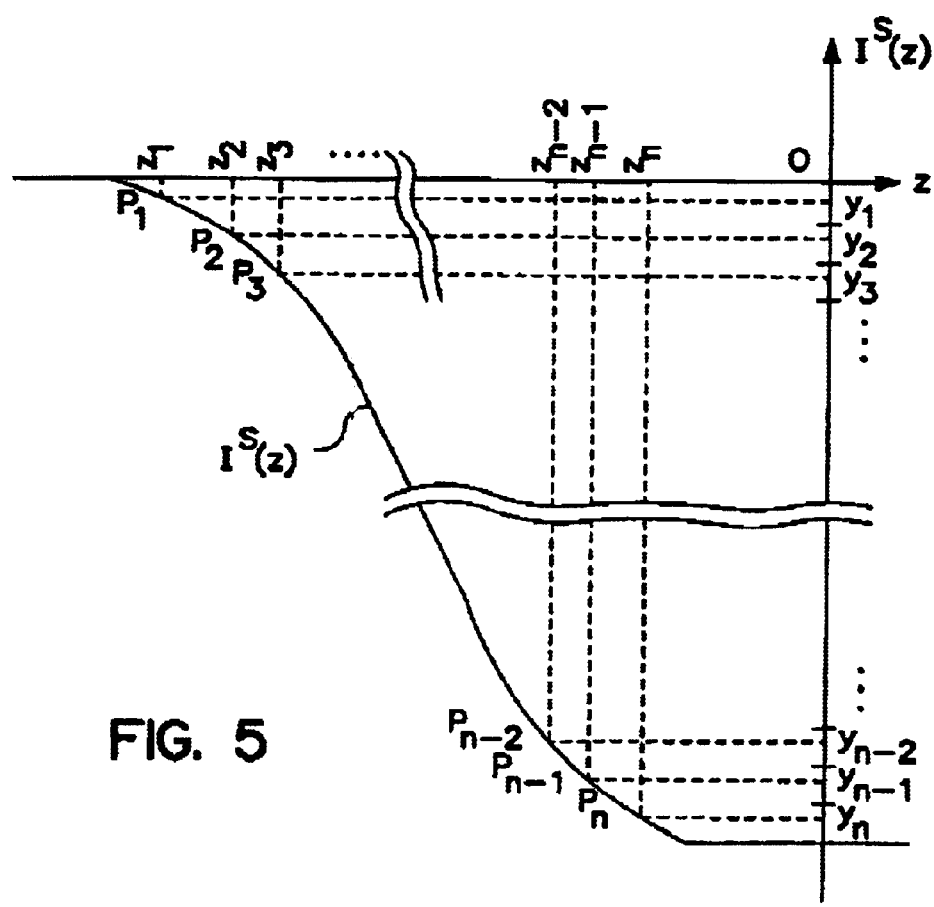
FIG. 5 is a graph of a portion of a current function related to the secondary coils which may be obtained by a method of this invention and for showing a method of winding a wire to form such secondary coils.

The inverse Fourier-transformed function $I^s(z)$ is approximately of a similar functional form as that of $I^p(z)$ except that they are negative to each other, the currents flowing in opposite directions through the coils 11 and 15 and through the coils 12 and 16 with reference to FIG. 1. In other words, $I^s(z)=0$ at $z=-\infty$ and becomes negative at the left-hand end of the left-hand secondary coil 15, reaches a maximum negative value at the right-hand end of the left-hand secondary coil 15, remains at this maximum negative value until z is increased to the left-hand end of the right-hand secondary coil 16, and returning to zero at the right-hand end of the right-hand secondary coil 16. For the convenience of disclosure, FIG. 5 shows only a portion of the curve for $I^s(z)$ for $z<0$. Generally, $I^p(z)$ and $I^s(z)$ are of different functional forms, and this means that the secondary coils are not formed by winding a wire uniformly even if the primary coils each have a uniform current distribution as shown in FIGS. 2–4.

If $I^s(z)$ is as shown in FIG. 5 and if each of the secondary coils 15 and 16 is to be formed by winding a wire N times where N is an integer, one of the methods would be to divide the distance along the vertical axis of FIG. 5 into N equal segments between the origin O and the position represented by $I^s(0)$, identifying the vertical coordinates of the middle points of these segments (indicated by symbols $y_j$ in FIG. 5 where $j=1, 2, \ldots, N$), noting the points on the curve having these vertical coordinates (indicated by symbols $P_j$ in FIG. 5 where $j=1, 2, \ldots, N$) and determining the z-coordinates (indicated by symbols $z_j$ in FIG. 5 where $j=1, 2, \ldots, N$) of these points $P_j$. The secondary coil 15 is formed by winding a wire at axial positions with the z-coordinates $z_j$ thus determined.

Although the invention was described above with the assumption that the primary coils 11 and 12 are evenly wound, it should be clear from the description above that it is not a required condition. With a different functional form of $j^p(\phi, z)$ and hence with that of $J_\phi^p(k)$, the equation for the linearity-establishing condition requires a different functional form of $J_\phi^s(k)$ from which a different current distribution $j_\phi^s(z)$ for the secondary coils 15 and 16 will be obtained.

The present invention is further applicable to extended Maxwell pairs without secondary coils (shield coils). In the absence of the secondary coils, the shielding factor $S_0$ is set equal to 1 and the equation shown above for the linearity-establishing condition is numerically solved either for d, given a, b and $z_0$ or for $z_0$, given a, b and d.

The disclosure presented above is not intended to limit the scope of the invention. The disclosure is intended to be interpreted broadly. For example, each primary coil designed for a uniform current distribution over a distance of d along the z-axis may be formed by winding a thin wire tightly and uniformly to approximate such a uniform current distribution or by spirally rolling a conductor sheet of width d around the z-axis. The invention does not impose any limitation as to the relative magnitude of a and d. Of particular interest, however, are examples wherein a and d are of a same order of magnitude, in contrast to traditional Maxwell pairs for which d<<a.

What is claimed is:

1. An extended Maxwell pair comprising:
   a pair of cylindrical gradient coils disposed coaxially around and along a z-axis extending in z-direction and symmetrically with respect to an origin, each being of radius a and of axial length d, said pair being mutually separated by a center-to-center distance $z_0$ which is greater than d; and
   means for causing equal magnitude currents to flow through said gradient coils in mutually opposite directions;
   values of d and $z_0$ being selected such that said equal currents generate a magnetic field along said z-axis with a linear gradient near said origin in said z-direction;
   a pair of cylindrical shield coils, said shield coils of equal radius and axially spaced and disposed coaxially around said gradient coils, each of said shield coils being of radius b which is greater than a, said means causing currents of equal magnitude and opposite sense and selected nonuniform axial current density dependence to flow through said shield coils, said shield coils causing cancellation of said gradient magnetic field outside said shield coils,
   wherein a, b, d and $z_0$ satisfy an equation given by $$\int_0^{k_{max}} dk k^4 \{\sin(kd/2)\sin(kz_0/2)/(kd/2)\} S_0(k) K_0'(ka) I_0(k\rho) = 0$$

where $S_o(k) = 1 - K_1(kb)I_1(ka)/K_1(ka)I_1(kb)$, $I_1$ and $K_1$ are modified Bessel functions, $k_{max}$ is an appropriately selected upper limit of integration and $\rho$ is an appropriately selected value less than a.

2. The extended Maxwell pair of claim 1 wherein said magnetic field along said z-axis, when expanded in a polynomial form in z, does not include a cubic term.

3. The extended Maxwell pair of claim 1 wherein each of said gradient coils comprises a helically rolled rectangular conductor sheet.

4. The extended Maxwell pair of claim 1 wherein each of said shield coils comprises a wire which is wound cylindrically at specified intervals, said intervals being determined such that said shield coils have effects of canceling magnetic field external to said shield coils.

5. The extended Maxwell pair of claim 1 wherein a and d are of the same order of magnitude.

6. The extended Maxwell pair of claim 1 wherein said gradient coils and said shield coils are structured such that said equal currents will have current distribution along said z-axis given by j and j respectively for said gradient coils and said shield coils, and an shielding equation given by $$I^s(k) = -(a/b)(I_1(ka)/I_1(kb))I^p(k)$$

is satisfied where $I_1$ are modified Bessel functions of the first kind, Ip(k) and Is(k) are current density functions Ip(z) and Ip(z) respectively for said gradient coils and said shield coils Fourier-transformed into k-space, $$I^p(z) = \int_{-\infty}^{z} dz' j^p(\varphi, z') \text{ and } I^s(z) = \int_{-\infty}^{z} dz' j^s(\varphi, z').$$

7. A method of designing an extended Maxwell pair, said extended Maxwell pair comprising:
   a pair of cylindrical gradient coil surfaces disposed coaxially around and spaced apart along a z-axis extending in z-direction and symmetrically with respect to an origin, each of said shield coil surfaces being of radius a and of axial length d, said pair being mutually separated by a center-to-center distance $Z_0$ which is greater than d; and
   a pair of cylindrical shield coil surfaces disposed coaxially around said primary coils, each of said shield coil surfaces being of radius b which is greater than a;
   said method comprising the steps of:
      specifying a gradient coil current distribution related to said gradient coils as equal currents are caused to flow through said gradient coils;
      obtaining a non-uniform axial shield coil current density distribution related to said shield coils as said equal currents are also caused to flow through said shield coils such that the magnetic field outside said shield coils is cancelled;
      expanding resultant magnetic field near said origin due to said equal currents by Fourier-Bessel series;
      deriving from said calculated resultant magnetic field a linearity-establishing equation for obtaining a linear gradient around said origin, wherein said linearity-establishing equation is given by $$\int_0^{k_{max}} dk k^4 \{\sin(kd/2)\sin(kz_0/2)/(kd/2)\} S_0(k) K_0'(ka) I_0(k\rho) = 0$$

where $S_0(k) = 1 - K_1(kb)I_1(ka)/K_1(ka)I_1(kb)$, $I_1$ and $K_1$ are modified Bessel functions, $k_{max}$ is an appropriately selected upper limit of integration and $\rho$ is an appropriately selected value less than a; and
      selecting a value of one of the parameters selected from the group consisting of d and $z_0$ to solve said linearity-establishing equation for the other of said parameters.

8. The method of claim 7 further comprising the step of approximating said shield coil current distribution by discrete conductor disposition on said cylindrical shield coil.

9. The method of claim 8 wherein said linearity-establishing equation is solved numerically.

10. The method of claim 7 wherein said linearity-establishing equation is solved numerically.

11. The method of claim 7 wherein said linearity-establishing equation is solved numerically.

12. The method of claim 7 further comprising the steps of:

calculating gradient coil current function $$I^P(z) = \int_{-\infty}^{z} dz' j^P(\varphi, z'),$$

where $j^P(\sigma, z')$ represents said specified gradient coil current distribution;

Fourier-transforming $I^P(s)$ into k-space to obtain $I^P(k)$;

obtaining a Fourier-transformed shield coil current function $I^s(k)$ in said k-space by a formula for canceling magnetic field outside said shield coils;

inverse Fourier-transforming $I^s(z)$ to obtain shield coil current function $I^s(z)$; and determining positions of loops of a wire to be wound cylindrically to form said shield coils from said shield coil current function $I^s(z)$.

13. The method of claim 12 wherein said formula for canceling magnetic field out said shield coils is given by $I^s(k)=-(a/b)(I_1(ka)/I_1,(kb))I^P(k)$.

14. The method of claim 7 wherein a and d are of a same order of magnitude.

* * * * *